United States Patent [19]
Forster

[11] 3,982,179
[45] Sept. 21, 1976

[54] MAGNETIC GRADIENT DETECTOR WITH MEANS FOR ADJUSTING THE PARALLELISM OF THE SENSORS

[76] Inventor: Friedrich M. O. Forster, Grathwohlstrasse 4, D-7410 Reutlingen, Germany

[22] Filed: Feb. 21, 1975

[21] Appl. No.: 551,640

[30] Foreign Application Priority Data
Feb. 22, 1974 Germany............................ 2408547

[52] U.S. Cl. ............................................. 324/43 G
[51] Int. Cl.² ....................................... G01R 33/02
[58] Field of Search ................... 324/43 R, 43 G, 47

[56] References Cited
UNITED STATES PATENTS

| | | | |
|---|---|---|---|
| 2,996,663 | 8/1961 | Ferguson | 324/43 R |
| 3,050,679 | 8/1962 | Schonstedt | 324/43 R |
| 3,281,660 | 10/1966 | Studenick | 324/3 |
| 3,439,264 | 4/1969 | Schonstedt | 324/43 R |

*Primary Examiner*—Robert J. Corcoran
*Attorney, Agent, or Firm*—George J. Netter

[57] ABSTRACT

The magnetic gradient detector has two magnetic field sensors with their magnetic axes arranged parallel to an imaginary line. The sensor electrical outputs are connected with one another such that an electrical signal is created corresponding to the gradient of the magnetic fields present at the respective locations of the sensors. Each sensor has its core suspended on a wire under tension which maintains the parallelism constant. The wires are adjustable to establish initial parallelism or correct for subsequent misalignment that may occur.

13 Claims, 3 Drawing Figures

MAGNETIC GRADIENT DETECTOR WITH MEANS FOR ADJUSTING THE PARALLELISM OF THE SENSORS

BACKGROUND OF THE INVENTION

The invention relates generally to a magnetic gradient detector having two magnetic field sensors whose magnetic axes are parallel to an imaginary line, and located a certain distance from one another along the imaginary line. The sensor electrical outputs are connected with one another such that an electrical signal is created corresponding to the gradient of the magnetic fields present at the respective locations of the sensors.

Detectors of this general kind have been used in the past for the detection and measurement of magnetic field gradients, and as well for discovering hidden ferro-magnetic bodies such as mines, unexploded bombs, ships, etc., from the disturbances such bodies cause in the ambient magnetic field of the earth.

Because of their sensitivity and simple construction, harmonic detectors are frequently used. Their sensing element includes a magnetizable core which is excited to saturation by an applied magnetic alternating field of a specific frequency. When a magnetic field to be measured is superimposed on the exciter field, even harmonics of the specific frequency occur in a coil surrounding the core, the amplitudes of which are proportional to the magnetic field strength being measured.

In many cases, such as the locating purposes referred to above, magnetic field gradients of the magnitude of a few $\gamma$ ($1\ \gamma = 10^{-5}$ oersteds) have to be resolved, while at the same time the gradient detector is subject to the full magnetic field of the earth, of about 0.3 oersteds. In order that, irrespective of any changes in its location, the gradient detector can suppress any influence from the undisturbed ambient magnetic field of the earth, it must meet two major requirements.

1. The two magnetic field sensors, which are electrically connected in opposition to one another, must possess an unchanging sensitivity over the whole range of magnetic field strengths to which they may be exposed.

2. The magnetically sensitive directions of the two magnetic field sensors, in other words their magnetic axes, must be parallel to within very small tolerances, and thus to the imaginary line referred to above.

While the first requirement can be met by compensating the average magnetic field of the earth at the location of both magnetic field sensors down to an almost zero level by the use of suitable reverse feedback coils, no fully satisfactory solution is yet known for the second problem. In a type of detector which has been used for many years, the two magnetic field sensors are installed in the upper and lower ends of a supporting tube, one end of each sensor being carried by a ball joint and the position of the other being adjustable by a setscrew. With this setup it is possible to obtain a very precise parallelism between the two sensors at a given moment, but the rigorous conditions of detection work cause them to slip out of adjustment, necessitating repetition of the paralleling operation from time to time. A great variety of factors can contribute to this misalignment, including temperature effects, impact or bending stresses, and many others. An indication of the level of parallelism required is given by pointing out that an angle as low as 1/100° between the two magnetic field sensors can constitute a perceptible misalignment. Naturally, it is highly undesirable to have to constantly repeat the detector paralleling operation, since it interrupts the flow of work. Furthermore, paralleling has to be carried out in a location free from disturbance from the magnetic field of the earth, i.e., practically in the open country.

SUMMARY

From the remarks above it can be seen that there is a need for a gradient detector for which the sensor paralleling can be set simply and very accurately, and for which it will remain stable. The invention meets this requirement by providing a gradient detector in which the magnetic field sensors are suspended on wires under tension which keeps the parallelism very constant, since even if the supporting construction bends, the wires remain parallel.

DESCRIPTION OF PREFERRED EMBODIMENTS

Figure 1:
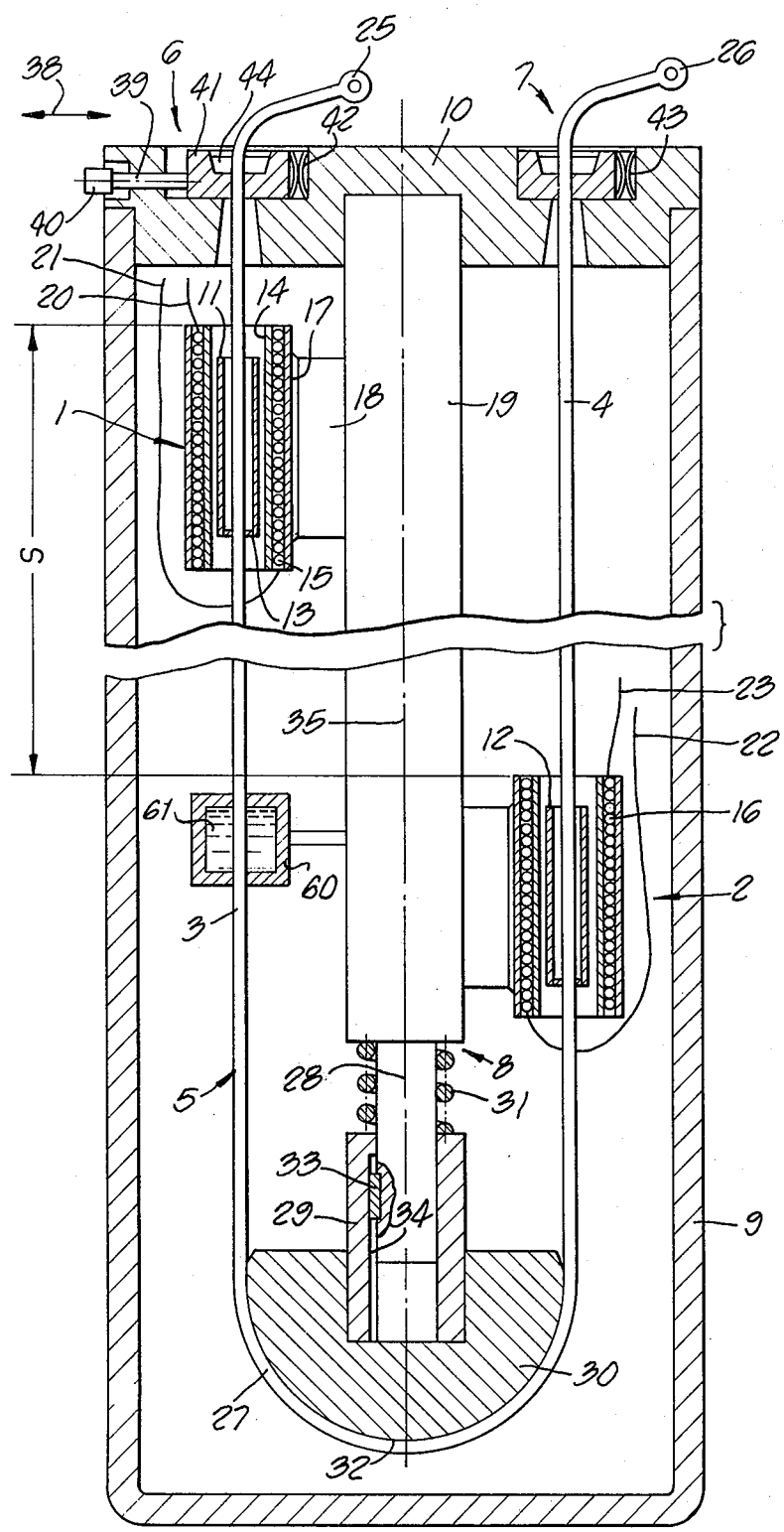
FIG. 1 is a side, elevational, sectional view of a gradient detector made in accordance with this invention.

FIG. 1 shows a sectional view of one form of gradient detector within the scope of the invention. This embodiment makes use of magnetic field sensors operating on the harmonic principle, but other suitable sensors may also be used advantageously. Furthermore, it is not intended to restrict the invention to the particularly favorable case described in the example, in which wires under tension have the simultaneous additional function of producing an exciter magnetic field.

The primary components of the gradient detector as shown in FIG. 1 are two magnetic field sensors 1 and 2, two wires under tension 3 and 4, which in this example comprise a single wire 5, two paralleling devices 6 and 7, a wire tensioning device 8, a protective tube 9 and a base plate 10. The two sensors 1 and 2 are identical in construction, with an important component being the small tube 11 or 12 which forms the respective cores of the harmonic detectors. These tubes are made of a high-grade ferro-magnetic material and before being installed must be subjected to a special annealing process to make them free of inner stresses. The longitudinal axis of each tube essentially forms the magnetic axis of the associated sensor, i.e., only if a component of a magnetic field vector falls along this axis will it be picked up or detected by the sensor.

The tube 11 is fixed at one end to the wire 3 by an annular attachment as at 13, which prevents the tube from being stressed as a result of expansion caused by heat. Lateral movement of the free end of the tube 11 can be prevented by the introduction of a little oil or grease into the space between the tube 11 and the wire 3. A cylindrical winding 15 is mounted on a tubular core 14, and both are placed inside a carrier tube 17, which is mounted by a bracket 18 onto a rod 19. It is also within the scope of the invention that the gradient detector be constructed with a winding attached to the tube 11, however the described example shows the particular advantages of suspending the winding independently of the detector core carried by the wire under tension. That is, this minimizes the mass connected to the wire under tension, thus keeping deflections of the wire within the closest possible limits. The free ends 20, 21 and 22, 23 of the windings 15 and 16 pass out of the unit for connection to apparatus to be described.

The wire 5, under tension as pointed out above, has the simultaneous additional function of providing magnetic excitation for the tubes 11 and 12. For this purpose an AC current $i$ at the frequency $f$ is connected to the ends 25 and 26 of the wire 5 and circularly magnetizes the cores 11 and 12 to saturation. For example, with the current $I$ starting at end 25, it passes through the wire 3, the U-shaped loop 27 and the wire 4 to finally reach the end 26.

The requisite high mechanical tension of the wire 5 is produced by adjusting the tensioning device 8 which is rigidly connected to the base plate 10 by the rod 19. The other end of the rod 19 is shouldered, and around this shoulder slides a precisely fitting sleeve 29, which in turn sits in a tensioner 30 made of non-conductive material. A powerful coil spring 31 presses the sleeve 29 and the tensioner 30 downward, thus tightening the wire 5 which runs in a groove 32 around the outer end of the tensioner.

To prevent the sleeve 29 and the tensioner 30 from twisting relative to the rod 19, a key 33 is slidingly fitted into the shoulder 28. The tensioning device 8 insures that the two wires 3 and 4 always remain virtually parallel to the center line 35, i.e., to the imaginary longitudinal axis of the gradient detector.

The two paralleling devices 6 and 7 provided to make the two sensors 1 and 2 exactly parallel are identical in construction, but arranged at an angle of 90° to each other. The first one allows the end of the wire 3 to be moved in the direction of the arrow 38, the second one allows the end of the wire 4 to be moved at right-angles to the plane of the drawing. Adjustment of parallelism is by setscrews in both cases, with only screw 39 being shown in FIG. 1. The screw 39 has a square head 40, and can be moved by means of its fine thread along the line of arrow 38 with respect to the base plate 10. The tip of screw 39 contacts the front of a slide 41 which is made of nonconductive material. The rear of the slide 41 is held spaced from the base plate 10 by a number of flat springs 42, so that movement of the screw 39 moves the slide backward or forward along a face of the base plate 10, against which it is pressed by a set of flat springs. These springs cannot be seen in FIG. 1 for the paralleling device 6, but they correspond identically to the springs 43 of the paralleling device 7. The wire 5 under tension passes through a hole in slide 41, where a tapered cone 44 pressed into a conical hole in the slide clamps onto the wire and holds it against the tension of the device 8.

The improvement in the stability of the parallelism can easily be understood from the above description. If the rod 19 bends in any direction whatsoever, the only result will be that the wires 3 and 4 will together change their direction accordingly, but the parallelism between them will be unaffected. By contrast in previous gradient detectors any bending of the tube carrying the field sensors had a direct and detrimental effect on parallelism.

Figure 2:
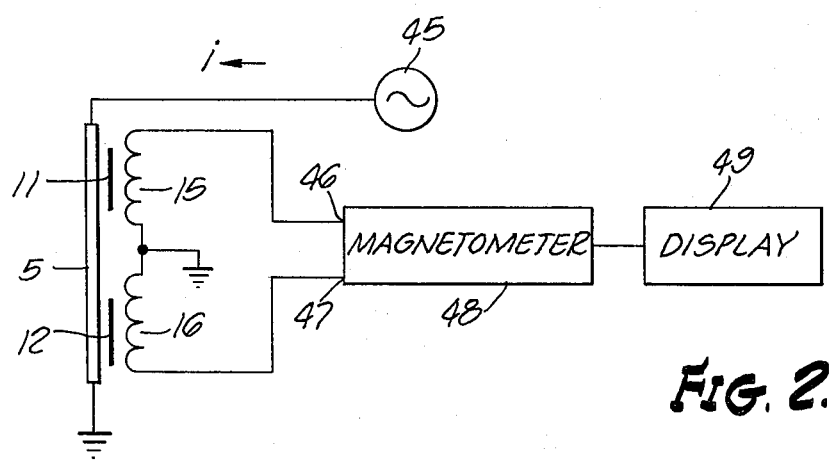
FIG. 2 is a schematic circuit diagram of the gradient detector described herein and associated equipment.

FIG. 2 shows a simplfied schematic circuit diagram for the harmonic detector described herein. Item 45 is an electric power generator which provides the exciter current i at the frequency f for the detector cores 11 and 12, which current passes through the wire 5. The windings 15 and 16 have one end each in common and grounded and the free ends connected to the inputs 46 and 47 of a magnetometer 48. The inputs to the magnetometer provide a voltage at a frequency of $2f$ and an output voltage is obtained corresponding to the magnetic field gradient at the locations of the magnetic field sensors 1 and 2. The magnetometer output is displayed on the instrument 49. The base of the magnetic field gradient displayed is thus formed by the distance s between the two magnetic field sensors 1 and 2.

Figure 3:
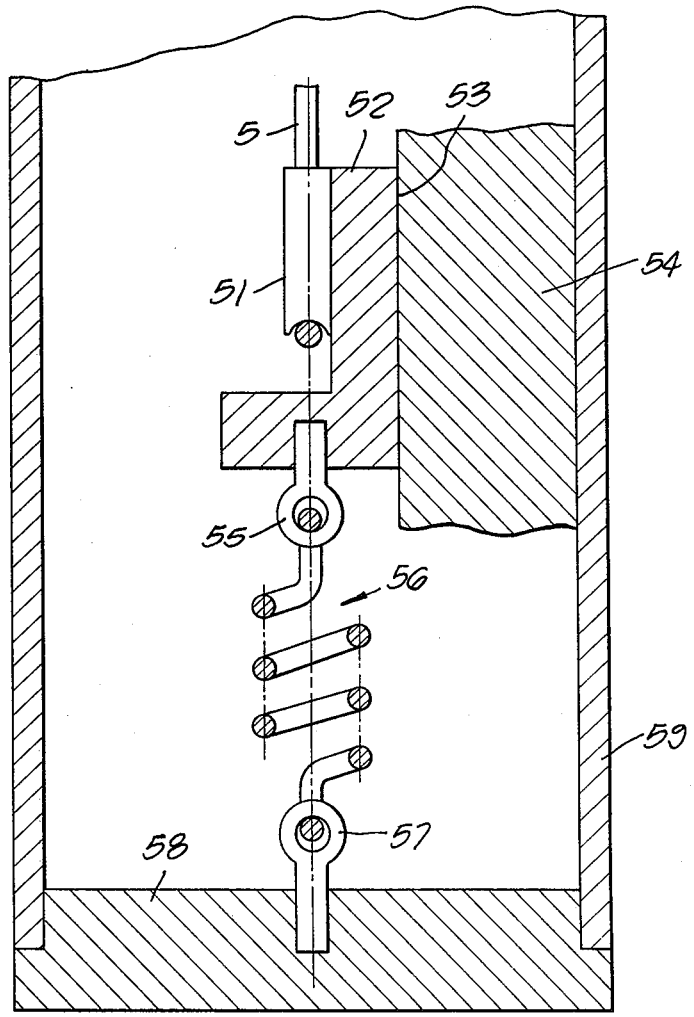
FIG. 3 is an enlarged sectional detail of a modified version of the gradient detector.

FIG. 3 shows a different version of the tensioning device. The wire under tension 5 passes around a tensioner 51, which may be the same construction as the tensioner 30 shown in FIG. 1. The tensioner 51 is rigidly connected with a bracket 52, the rear side of which is in frictional contact with the surface 53 of a chock 54, by which it is prevented from twisting. Via an eyelet headed screw 55, a spring 56 acts on the underside of the bracket 52. The other end of spring 56 is attached by a second eyelet headed screw 57 to the base 58 of the protective tube 59. Other forms of supension for the wire under tension 5 are also possible. Instead of the rigid tensioners 30 or 51, for example, a guide pulley could be used, although strict requirements would have to be met with regard to its roundness and bearings. It is also considered within the scope of this invention to suspend the lower ends of the wires 3 and 4 independently of each other, with one or both of the paralleling devices fitted at the lower end of the wires.

Although physical oscillations which may occur in the wire are generally at a frequency which because of the wire tension is high enough not to be troublesome, means for counteracting such oscillations are useful and will also be described at this time. In the probable area of the antinode of such oscillation, which, because of the low mass of the tubes 11 and 12 will be located a slight distance from the middle of the wires 3 or 4, the wire may pass through a small tube 60 attached to the rod 19 and which contains an oscillation-damping fluid 61 held in the tube by capillary action. (Although only one is shown about wire 3, a similar one would be mounted about wire 4.)

I claim:
1. A magnetic gradient detector having two magnetic field sensors, the magnetic axes of which are parallel to an imaginary line, said sensors being installed a predetermined distance from one another along the imaginary line and having respective electrical outputs connected together to provide an electrical signal corresponding to the gradient of the magnetic fields present at the location of the two magnetic field sensors, the improvement comprising:
   each magnetic field sensor is connected to a separate wire maintained in axial tension, said wires being arranged parallel to each other and to the imaginary line; and
   first and second means respectively connected to said wires for adjustably shifting the wires in planes perpendicular to each other and to the respective wires.
2. A magnetic gradient detector as claimed in claim 1, in which the two wires are tensioned by at least one spring.
3. A magnetic gradient detector as claimed in claim 1, in which the two wires are integrally interconnected and an intermediate portion thereof engages a tensioner.

4. A magnetic gradient detector as claimed in claim 1, in which magnetic field sensors are harmonic detectors having tubular cores coaxially received on the wires.

5. A magnetic gradient detector as claimed in claim 4, in which each tubular detector core is attached at one end to the respective wire.

6. A magnetic gradient detector as claimed in claim 4, in which receiver windings are provided on the magnetic field sensors which windings are suspended independently of the detector cores and the wires.

7. A magnetic gradient detector as claimed in claim 5, in which the detector cores are magnetically excited by an electric current passing through the wires.

8. A magnetic gradient detector as claimed in claim 1, in which there is further provided a hollow tube received about each of said wires including a quantity of fluid therein for damping mechanical oscillations of said wires.

9. A magnetic gradient detector as claimed in claim 8, in which said hollow tubes are located substantially at an antinode of said wires.

10. A magnetic gradient detector, comprising:
a rod;
first and second helical windings affixed to said rod at spaced points with the respective axes parallel to each other;
a wire passing through both of said windings;
first and second hollow tubular cores of ferromagnetic material received on said wire, located respectively within the first and second helical windings and affixed to said wire;
means mounted on said rod contacting an intermediate portion of said wire for adjustably tensioning said wire;
a base plate having openings through which the respective ends of the wire pass; and
means in said base plate openings for clampingly securing said wire and for adjustably positioning said wire.

11. A magnetic gradient detector as claimed in claim 10, in which the cores are magnetically excited by an electric current passing through the wire.

12. A magnetic gradient detector as claimed in claim 10, in which there is further provided a hollow tube received about said wire including a quantity of material therein contacting said wire and damping mechanical oscillations thereof.

13. A magnetic gradient detector as claimed in claim 12, in which said hollow tube is located substantially at an oscillation antinode of said wire.

* * * * *